United States Patent
Awaji et al.

(10) Patent No.: US 7,453,932 B2
(45) Date of Patent: Nov. 18, 2008

(54) TEST DEVICE AND SETTING METHOD

(75) Inventors: Toshiaki Awaji, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 563 days.

(21) Appl. No.: 11/094,325

(22) Filed: Mar. 30, 2005

(65) Prior Publication Data

US 2005/0243906 A1    Nov. 3, 2005

(30) Foreign Application Priority Data

Apr. 1, 2004    (JP)    ............................. 2004-109297

(51) Int. Cl.
*H04L 27/00*    (2006.01)

(52) U.S. Cl. .................. 375/224; 375/225; 375/229; 375/230; 375/231; 375/232; 375/233; 375/234; 375/235; 375/236; 324/500; 324/158; 324/754; 324/755; 324/759; 324/537; 324/765; 324/763; 370/229; 370/230; 370/231; 370/232; 370/233; 370/234; 370/235; 333/18; 333/28; 381/103; 708/323

(58) Field of Classification Search ......... 375/224–225, 375/229–236; 324/500, 158, 754, 755, 759, 324/537, 765, 763; 370/229–235; 333/18, 333/28; 381/103; 708/323

See application file for complete search history.

(56) References Cited

U.S. PATENT DOCUMENTS

| | | | | |
|---|---|---|---|---|
| 5,266,894 A | * | 11/1993 | Takagi et al. ................. | 324/765 |
| 6,133,725 A | * | 10/2000 | Bowhers .................. | 324/158.1 |
| 6,239,667 B1 | * | 5/2001 | Roth ........................... | 333/18 |
| 6,360,180 B1 | * | 3/2002 | Breger ........................ | 702/108 |
| 2004/0187049 A1 | * | 9/2004 | West ........................... | 714/699 |

\* cited by examiner

*Primary Examiner*—David C Payne
*Assistant Examiner*—Zewdu Kassa
(74) *Attorney, Agent, or Firm*—Osha · Liang LLP (57) ABSTRACT

A testing apparatus for testing a device under test is provided, wherein the testing apparatus includes: a comparator for receiving a signal output from the device under test and converting the signal into a logic signal by comparing the signal with a first reference voltage; a driver for amplifying a logic signal to be output to the device under test on the basis of a second reference voltage and outputting to the device under test; a comparator setting unit for determining the first reference voltage so as to compensate for a delay amount of a reception signal received from the device under test and setting the comparator to be the first reference voltage; and a driver setting unit for determining the second reference voltage on the basis of the reference voltage of the comparator and setting the driver to be the second reference voltage.

8 Claims, 7 Drawing Sheets

TEST DEVICE AND SETTING METHOD

This patent application claims priority from a Japanese patent application No. 2004-109297 filed on Apr. 1, 2004, the contents of which are incorporated herein by reference.

BACKGROUND OF THE INVENTION

1. Field of the Invention

The present invention relates to a testing apparatus and a setting method. More particularly, the present invention relates to a testing apparatus and a setting method for determining pass/fail of a device under test.

2. Description of the Related Art

Conventionally, a self-test for testing input and output of a signal of a device under test by looping back a signal output by the device under test to input to the device under test with loop-back (BIST: Built In Self Test) is performed. It is possible to determine whether or not the device under test is normal when used as well as when manufactured by the self-test.

A device under test includes an output buffer for amplifying and outputting a signal and an input buffer for amplifying an input signal. However, it is impossible to test the whole of a device under test including an output buffer and an input buffer provided nearer to the terminal side than a circuit for looping back a signal by the self-test.

If a testing apparatus for testing a device under test makes a loop-back of a signal output from the device under test to the device under test, it is possible to test the whole of the device under test including the output buffer and the input buffer. However, in this case, sometimes it is impossible to perform a testing using a logic signal of relatively high frequency because a signal is delayed between the device under test and the testing apparatus.

SUMMARY OF THE INVENTION

Therefore, it is an object of the present invention to provide a testing apparatus and a setting method, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus for testing a device under test includes: a comparator for receiving a signal output from the device under test and converting the signal into a logic signal by comparing the signal with a first reference voltage; a driver for amplifying a logic signal to be output to the device under test on the basis of a second reference voltage and outputting to the device under test; a comparator setting unit for determining the first reference voltage so as to compensate for a delay amount of a reception signal received from the device under test and setting the comparator to be the first reference voltage; and a driver setting unit for determining the second reference voltage on the basis of the reference voltage of the comparator and setting the driver to be the second reference voltage.

Further, the driver may amplify the logic signal converted by the comparator on the basis of the second reference voltage and output it to the device under test.

Further, the driver setting unit may raise the second reference voltage to a voltage higher than it was in case the comparator lowers the first reference voltage to a voltage lower than it was.

According to the second aspect of the present invention, a testing apparatus, which includes an equalizer able to set an amplification amount for each frequency component and tests a device under test, includes: a reception side equalizer for receiving and amplifying a signal output from the device under test; a transmission side equalizer for amplifying a signal which should be output to the device under test and outputting the signal to the device under test; a reception side equalizer setting unit for determining an amplification amount by which the reception side equalizer amplifies a predetermined frequency component of a reception signal received from the device under test so as to compensate for a delay amount of the reception signal and setting the reception side equalizer to be the amplification amount; and a transmission side equalizer setting unit for determining an amplification amount by which the transmission side equalizer amplifies a predetermined frequency component of a transmission signal transmitted to the device under test on the basis of the amplification amount set by the reception side equalizer setting unit and setting the transmission side equalizer to be the amplification amount.

Further, the transmission side equalizer may further amplify the signal amplified by the reception side equalizer and transmit it to the device under test Further, the transmission side equalizer setting unit may increase the amplification amount of the transmission signal transmitted to the device under test in case the reception side equalizer setting unit increases the amplification amount by which the predetermined frequency component is amplified.

According to the third aspect of the present invention, a setting method of a testing apparatus for testing a device under test is provided, wherein the testing apparatus includes: a comparator for receiving a signal output from the device under test and converting the signal into a logic signal by comparing the signal with a first reference voltage; and a driver for amplifying a logic signal to be output to the device under test on the basis of a second reference voltage and outputting to the device under test, and the testing method includes: a comparator setting step of determining the first reference voltage so as to compensate for a delay amount of a reception signal received from the device under test and setting the comparator to be the first reference voltage; and a driver setting step of determining the second reference voltage on the basis of the reference voltage of the comparator and setting the driver to be the second reference voltage.

According to the fourth aspect of the present invention, a testing apparatus for testing an electronic device includes: a setting method of a testing apparatus, which includes an equalizer able to set an amplification amount for each frequency component and tests a device under test, is provided, wherein the testing apparatus includes: a reception side equalizer for receiving and amplifying a signal output from the device under test; and a transmission side equalizer for amplifying a signal which should be output to the device under test and outputting the signal to the device under test, and the setting method includes: a reception side equalizer setting step of determining an amplification amount by which the reception side equalizer amplifies a predetermined frequency component of a reception signal received from the device under test so as to compensate for a delay amount of the reception signal and setting the reception side equalizer to be the amplification amount; and a transmission side equalizer setting step of determining an amplification amount by which the transmission side equalizer amplifies a predetermined frequency component of a transmission signal transmitted to the device under test on the basis of the amplification amount set in the reception side equalizer setting step and setting the transmission side equalizer to be the amplification amount.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
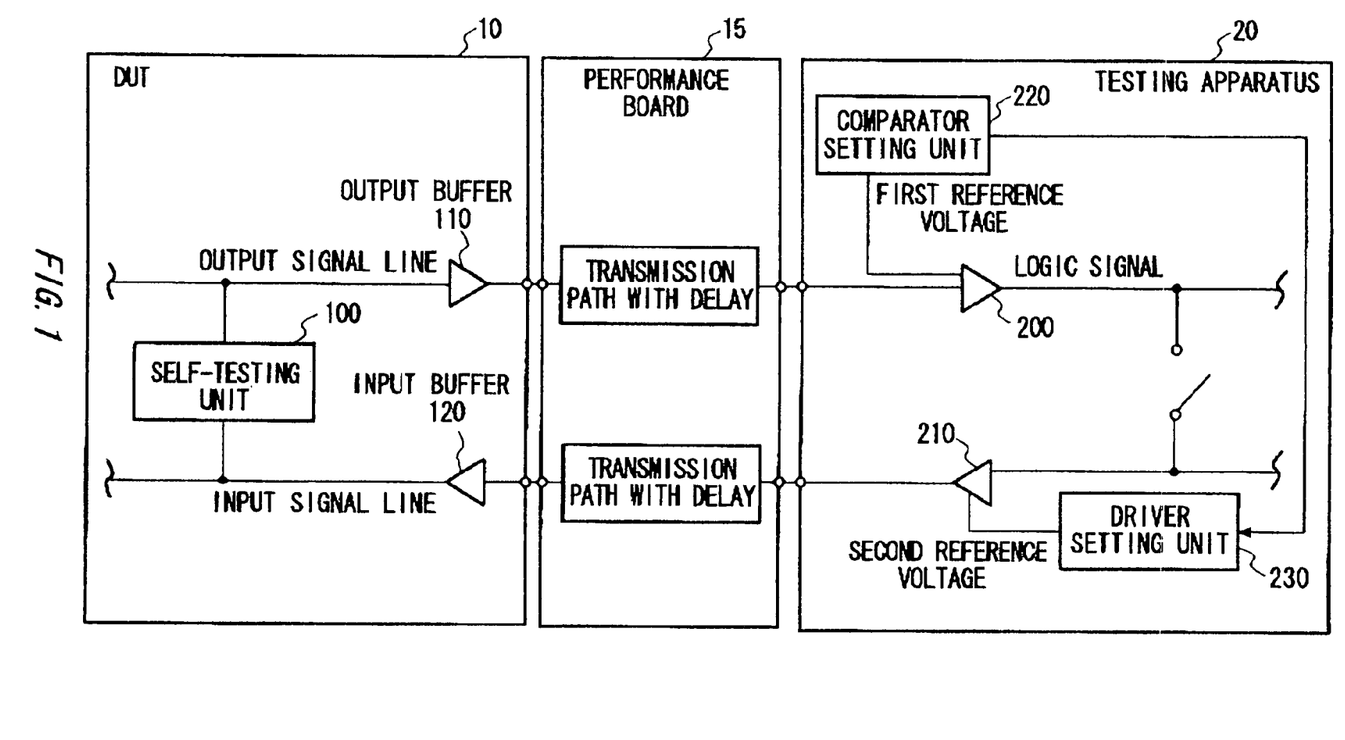
FIG. 1 shows an example of a block diagram of a device under test 10 and a testing apparatus 20.

FIG. 1 shows an example of a block diagram of a device under test 10 and a testing apparatus 20. The device under test 10 ("DUT") is a device to be tested by the testing apparatus 20 and includes a self-testing unit 100, an output buffer 110, and an input buffer 120. The self-testing unit 100 determines pass/fail of the DUT 10. The output buffer 110 transmits a signal output from the DUT 10 to the outside. The input buffer 120 receives a signal input to the DUT 10 from the outside.

The testing apparatus 20 includes a comparator 200, a driver 210, a comparator setting unit 220, and a driver setting unit 230. The comparator 200 receives a signal output from the DUT 10 via a performance board 15 and converts the signal into a logic signal by comparing with a first reference voltage. The driver 210 amplifies the logic signal generated by conversion of the comparator 200 on the basis of a second reference voltage and outputs it to the DUT 10.

The comparator setting unit 220 determines the first reference voltage so as to compensate for a delay amount of a reception signal received from the DUT 10 and sets the comparator 200 to be the first reference voltage. For example, the comparator setting unit 220 may measure a delay amount by which the reception signal is delayed on a signal transmission path from the DUT 10 and the testing apparatus 20 in advance and determine the first reference voltage on the basis of the measured delay amount. The driver setting unit 230 determines the second reference voltage of the driver 210 on the basis of the first reference voltage of the comparator 200 set by the comparator setting unit 220 and sets the driver 210 to be the second reference voltage.

Figure 2:
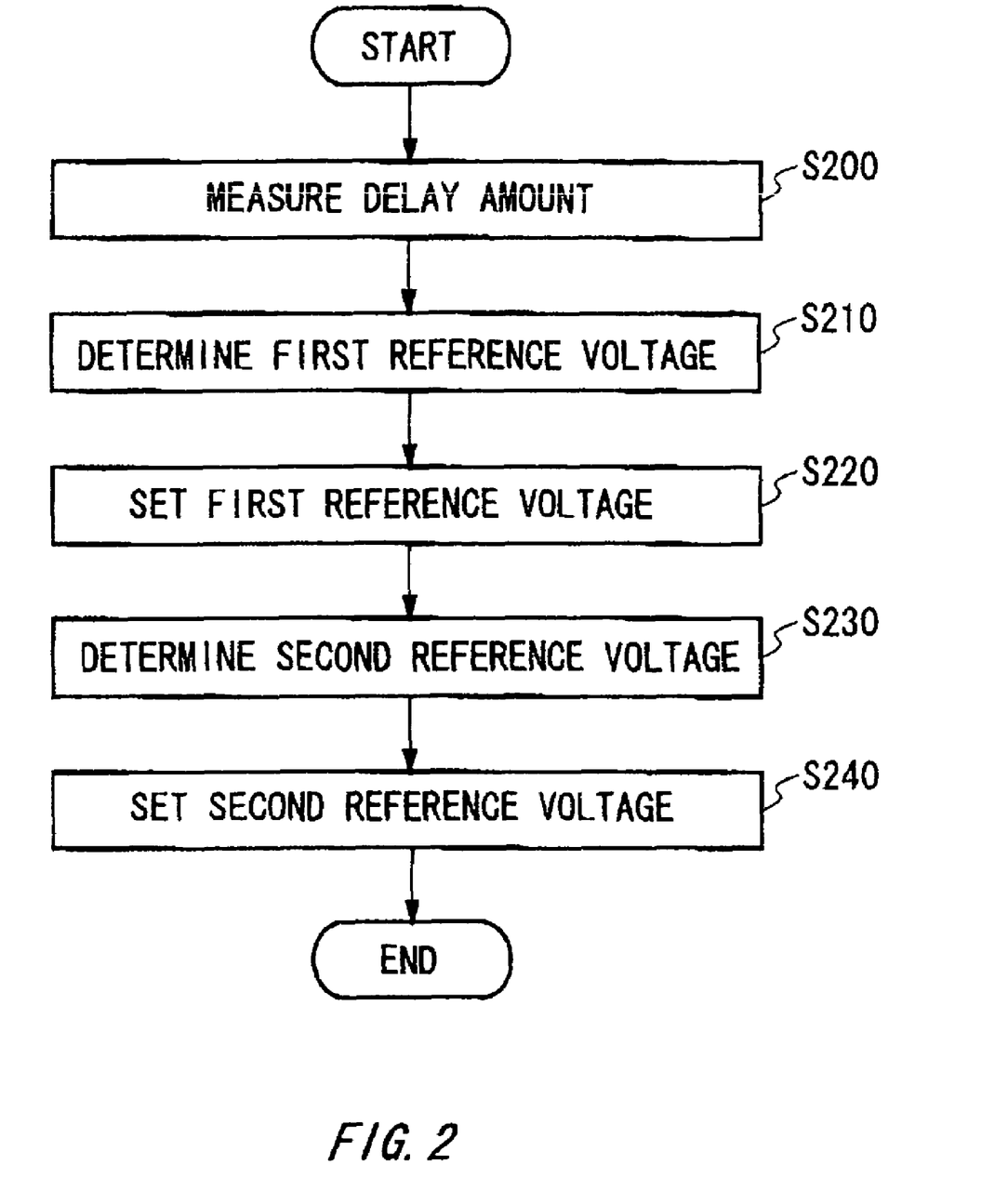
FIG. 2 shows an operation flow of a setting method for setting the testing apparatus 20.

FIG. 2 shows an operation flow of a setting method for setting the testing apparatus 20. The comparator setting unit 220 measures the delay amount by which the reception signal is delayed on the signal transmission path from the DUT 10 to the testing apparatus 20 (S200). The comparator setting unit 220 determines the first reference voltage compensating for the measured delay amount (S210). Then, the comparator setting unit 220 sets the comparator 200 to be the first reference voltage (S220).

The driver setting unit 230 determines the second reference voltage of the driver 210 on the basis of the first reference voltage of the comparator 200 set by the comparator setting unit 220 (S230). Then, the driver setting unit 230 sets the driver 210 to be the second reference voltage (S240). For example, the driver setting unit 230 may raise the second reference voltage to a voltage higher than it was in case the comparator setting unit 220 lowers the first reference voltage to a voltage lower than it was. Thus, it is possible to compensate for delay of an output side transmission path of which characteristics and wiring length are substantially the same as those of an input side transmission line on the basis of delay of the input side transmission line.

Figure 3:
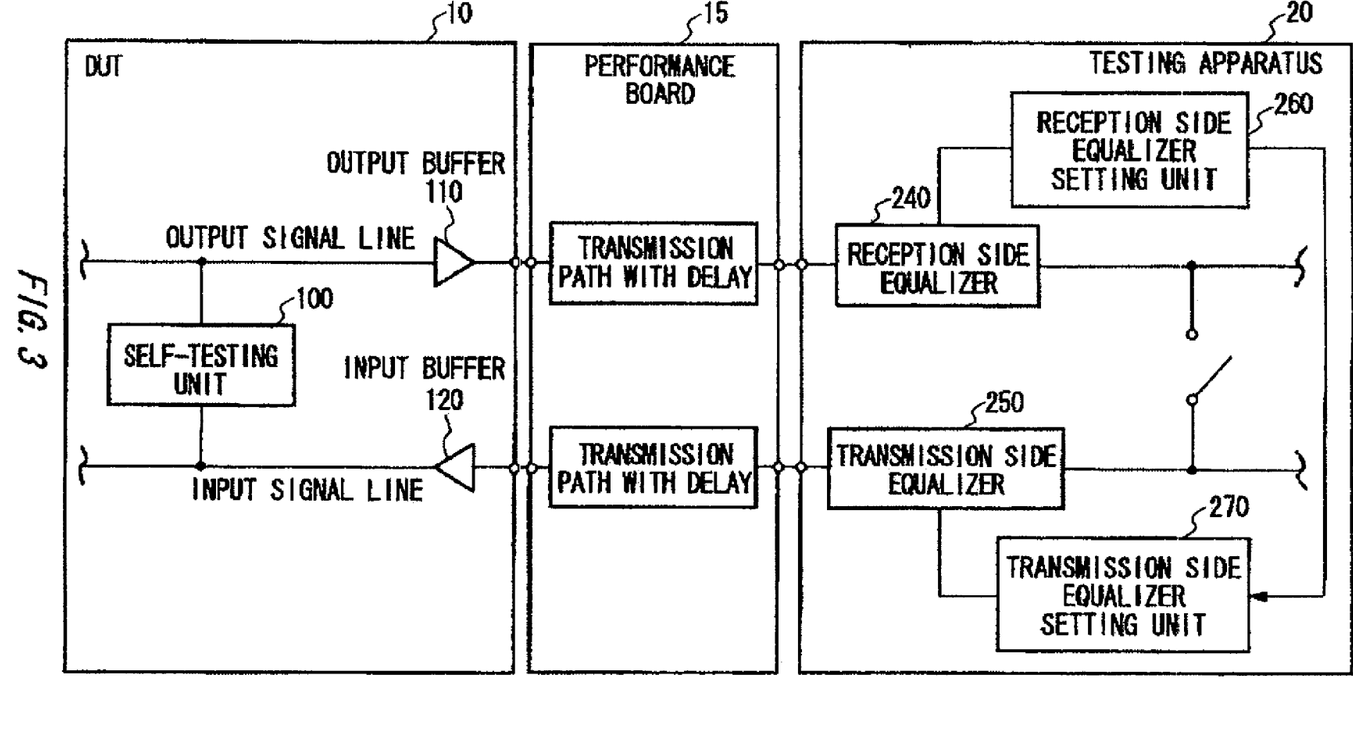
FIG. 3 shows an example of a block diagram of the device under test 10 and the testing apparatus 20 according to a modified embodiment.

FIG. 3 shows an example of a block diagram of the DUT 10 and the testing apparatus 20 according to a modified embodiment. Since the configuration of the DUT 10 according to the present example is substantially the same as that of the DUT 10 of FIG. 1, description on the DUT according to the present example is omitted. The testing apparatus 20 according to the present example includes a reception side equalizer 240, a transmission side equalizer 250, a reception side equalizer setting unit 260, and a transmission side equalizer setting unit 270. The reception side equalizer 240 receives a signal output from the DUT 10 via the performance board 15 and amplifies it. Then, the transmission side equalizer 250 further amplifies the signal amplified by the reception side equalizer 240 and transmits it to the DUT 10.

The reception side equalizer setting unit 260 determines an amplification amount by which a predetermined frequency component of a reception signal received from the DUT 10 is amplified by the reception side equalizer 240 so as to compensate for a delay amount of the reception signal and sets the reception side equalizer 240 to be the amplification amount. For example, the reception side equalizer setting unit 260 may measure the delay amount of the reception signal received from the DUT 10 in advance and determine the amplification amount on the basis of the measured delay amount. The transmission side equalizer setting unit 270 determines an amplification amount by which a predetermined frequency component of a transmission signal transmitted to the performance board 15 is amplified by the transmission side equalizer 250 on the basis of the amplification amount set by the reception side equalizer setting unit 260 and sets the transmission side equalizer 250 to be the amplification amount.

Figure 4:
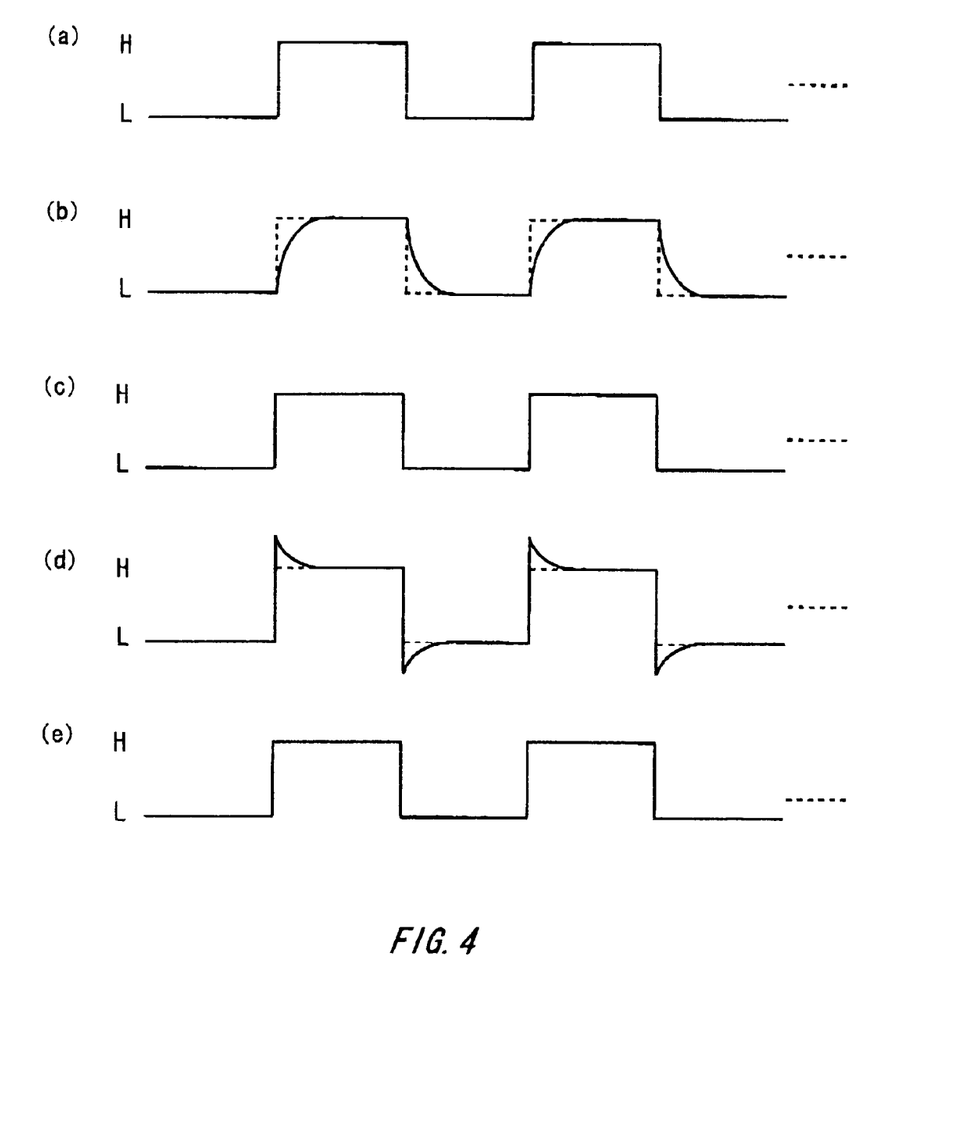
FIG. 4A shows an example of a signal output from the device under test 10.
FIG. 4B shows an example of a reception signal received by a reception side equalizer 240.
FIG. 4C shows an example of a reception signal amplified by the reception side equalizer 240.
FIG. 4d shows an example of a reception signal amplified by a transmission side equalizer 250.
FIG. 4E shows an example of a signal input to the device under test 10.

FIG. 4A shows an example of the signal output from the DUT 10. FIG. 4B shows an example of the reception signal received by the reception side equalizer 240. As shown in the figures, a predetermined high frequency component of the signal output from the DUT 10 is attenuated on a transmission path of the performance board 15 and thee like, and thus, the signal is delayed. FIG. 4C shows an example of the reception signal amplified by the reception side equalizer 240. As shown in the present figure, the reception side equalizer 240 can compensate for the delay of the reception signal by amplifying the attenuated high frequency component.

FIG. 4d shows an example of the reception signal amplified by the transmission side equalizer 250. As shown in the present figure, the transmission side equalizer 250 amplifies a predetermined high frequency component to be attenuated on a transmission path so as to compensate for delay of the transmission signal in advance. FIG. 4e shows an example of the signal input to the DUT 10. As shown in the present figure, a signal of which wave form is substantially the same as that of the output signal is input to the DUT 10. Thus, it is possible to loop back properly the signal output from the DUT 10 to input to the DUT 10.

Figure 5:
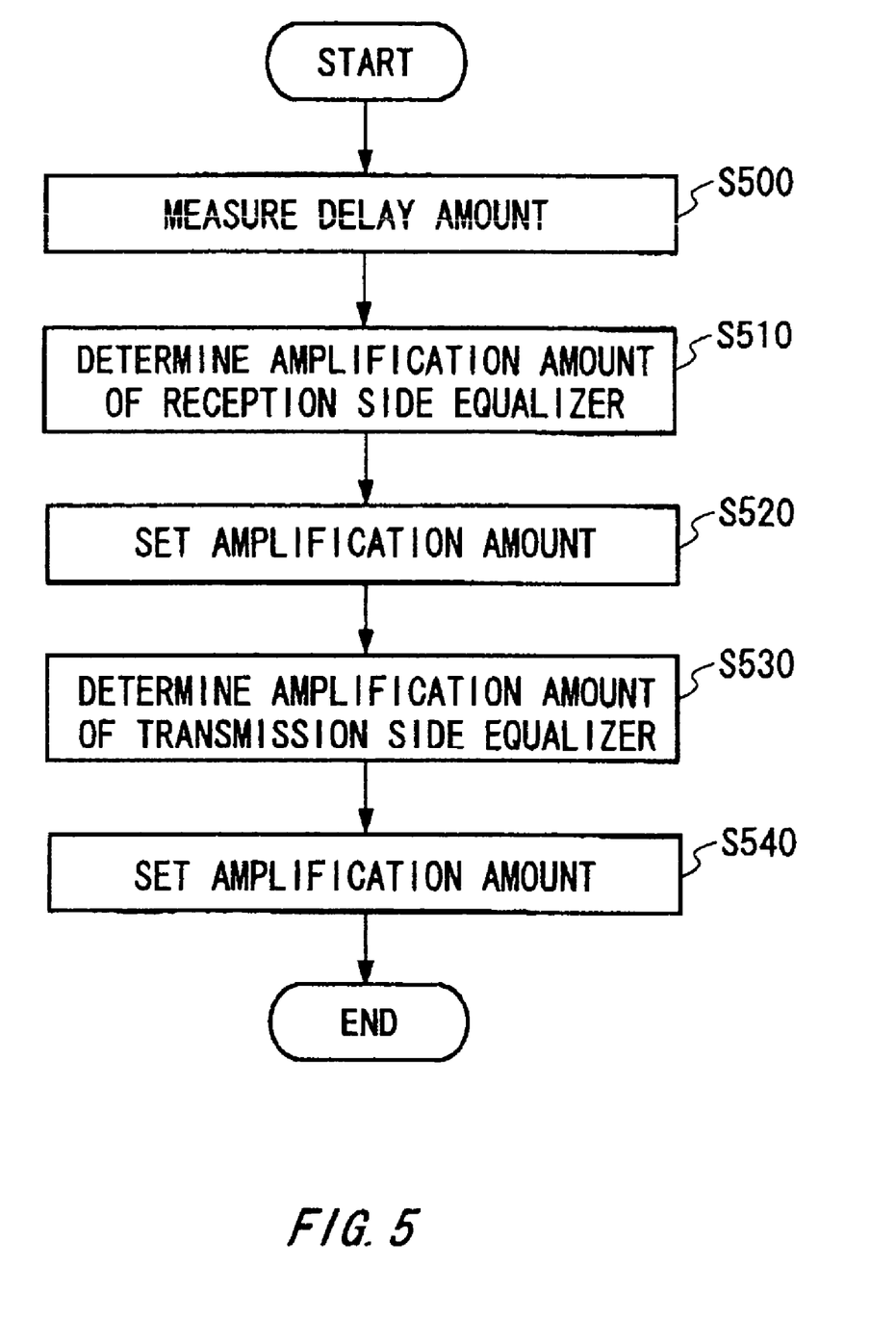
FIG. 5 shows an operation flow of a setting method for setting the testing apparatus 20 according to a modified embodiment.

FIG. 5 shows an operation flow of a setting method for setting the testing apparatus 20 according to a modified embodiment. The reception side equalizer setting unit 260 measures a delay amount of the reception signal received from the DUT 10 (S500). The reception side equalizer setting unit 260 determines an amplification amount by which a predetermined frequency component of the reception signal is amplified by the reception side equalizer 240 on the basis of the measured delay amount (S510). More specifically, the reception side equalizer setting unit 260 determines the amplification amount which compensates for the delay amount. Then, the reception side equalizer setting unit 260 sets the reception side equalizer 240 to be the determined amplification amount (S520).

The transmission side equalizer setting unit 270 determines an amplification amount by which a predetermined frequency component of the transmission signal transmitted to the performance board 15 is amplified by the transmission side equalizer 250 on the basis of the amplification amount set by the reception side equalizer setting unit 260 (S530). For example, in case the reception side equalizer setting unit 260 increases the amplification amount by which the predetermined frequency component is to be amplified, the transmission side equalizer setting unit 270 increases the amplification amount of the transmission signal transmitted to the DUT 10. Then, the transmission side equalizer setting unit 270 sets the transmission side equalizer 250 to be the determined amplification amount (S540). Thus, it is possible to compensate for the delay of the output side transmission path on the basis of the delay of the input side transmission path of which characteristics and wiring length are substantially the same as those of the output side transmission path.

As above, according to the embodiment and the modified embodiment shown in FIGS. 1 to 5, the testing apparatus 20 can get a proper logic signal by compensating for a delay amount even in case the reception signal received from the DUT 10 is delayed. Thus, it is possible to properly perform a testing even on a logic signal of relatively high frequency. Further, the testing apparatus 20 can loop back properly the signal output from the DUT 10 outside the DUT 10 by compensating for the delay of the transmission signal transmitted to the DUT 10 in advance. Thus, it is possible to properly perform a testing on the whole of the DUT 10 including the output buffer 110 and the input buffer 120.

Figure 6:
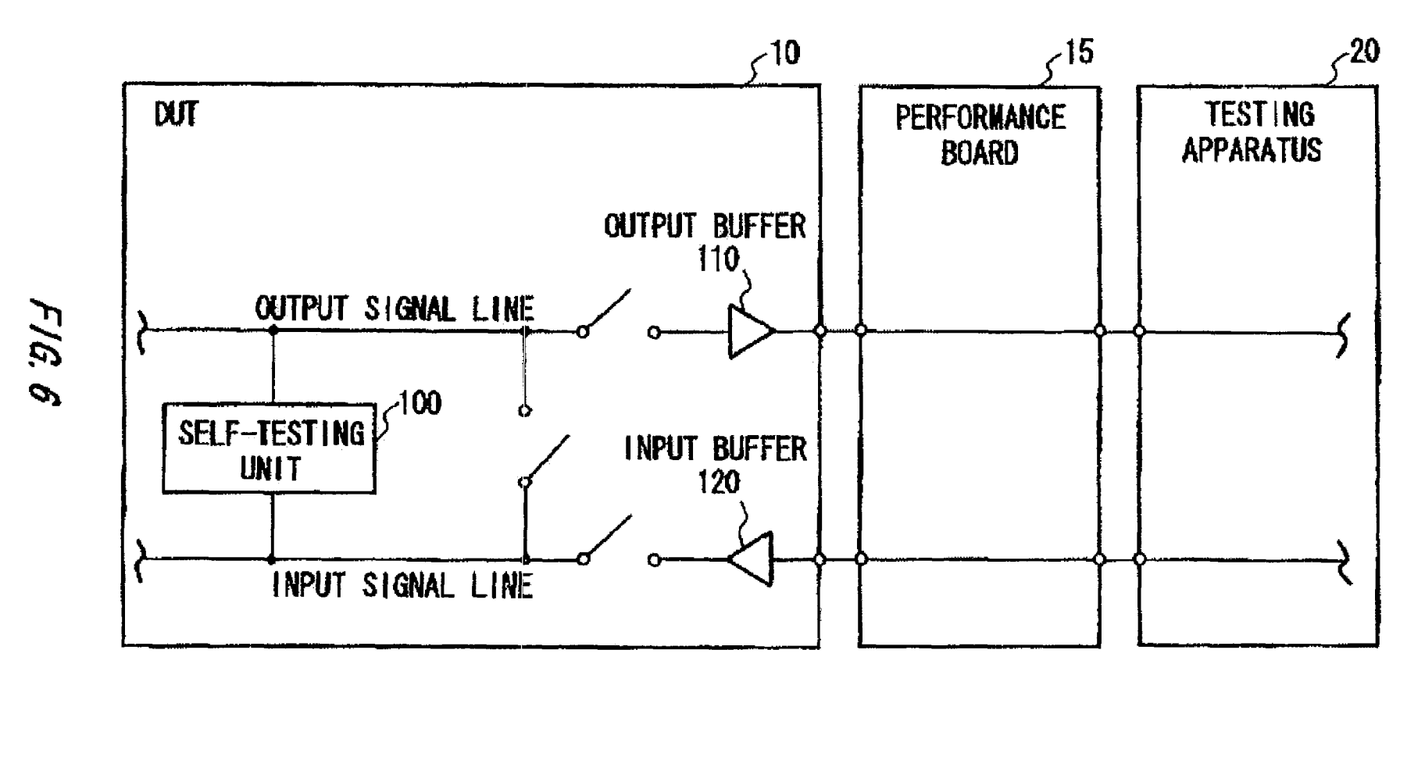
FIG. 6 shows a block diagram of the device under test 10 and the testing apparatus 20 according to another example for testing the device under test 10.

FIG. 6 shows a block diagram of the DUT 10 and the testing apparatus 20 according to another example for testing the DUT 10. The DUT 10 according to the present example includes the self-testing unit 100, the output buffer 110, the input buffer 120, an output signal line via which a signal to be output is transmitted, an input signal line via which a signal to be input is transmitted, and a switch connecting the input buffer 120 or the output signal line to the input signal line. The self-testing unit 100 is a device for determining pass/fail of the DUT 10. The output buffer 110 transmits a signal output from the DUT 10 to the outside. The input buffer 120 receives a signal input to the DUT 10 from the outside.

According to the example of the present figure, the DUT 10 can self-test (BIST) whether or not the DUT 10 operates properly without the testing apparatus 20. However, it is impossible to test the whole of a device under test including an output buffer and an input buffer provided nearer to the terminal side than a circuit for looping back a signal by the self-test. In comparison with that, it is possible to test properly the whole of the DUT 10 including the output buffer 110 and the input buffer 120 according to the examples shown in FIGS. 1 to 5.

Figure 7:
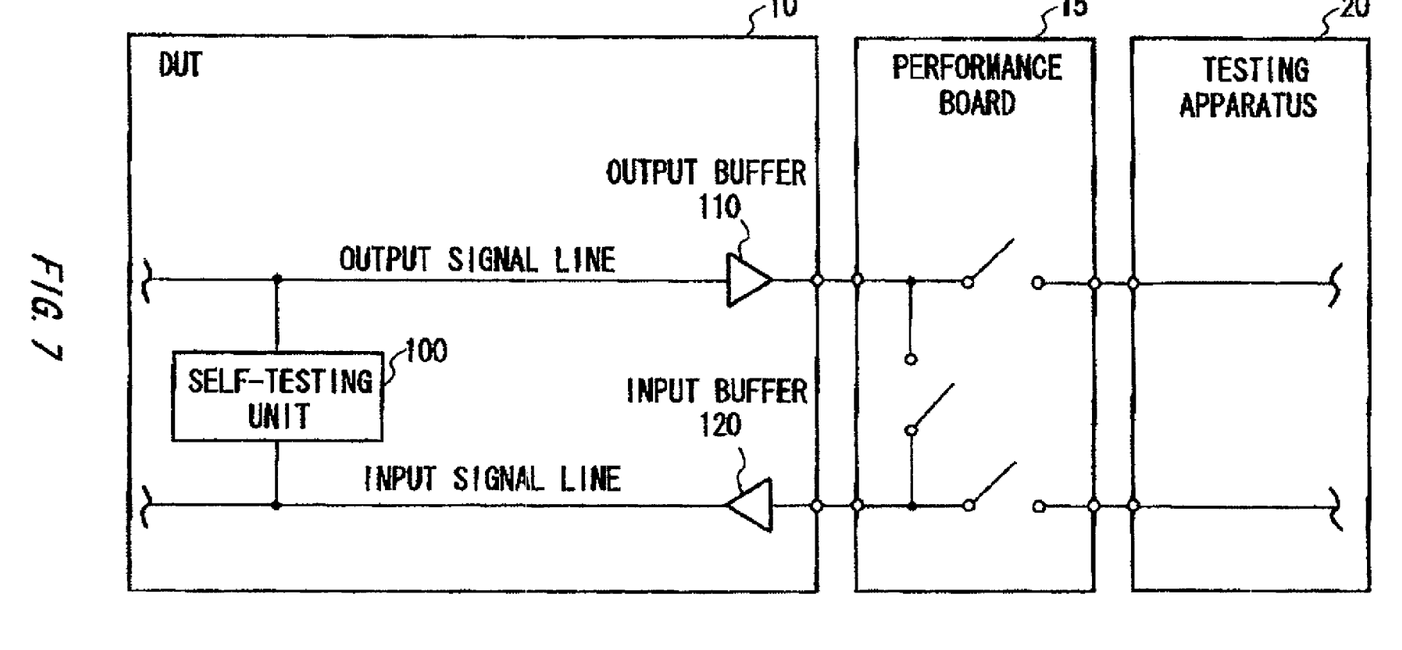
FIG. 7 shows a block diagram of the device under test 10 and the testing apparatus 20 according to another example for testing the device under test 10.

FIG. 7 shows a block diagram of the DUT 10 and the testing apparatus 20 according to another example for testing the DUT 10. Since the configuration of the DUT 10 according to the present example is substantially the same as that of the DUT 10 described with respect to FIG. 1, description on the DUT 10 is omitted. The performance board 15 according to the present example includes a switch for inputting a transmission signal transmitted from the testing apparatus 20 and a signal output from the DUT 10 to the DUT 10. Thus, the performance board 15 can loop back the signal output from the DUT 10 to the DUT 10.

It is also possible to test the whole of the DUT 10 including the output buffer 110 and the input buffer 120 by the present example because a transmission path for looping back a signal output from the DUT 10 can be provided outside of the DUT 10. However, according to the present example, since the switch is provided on the signal transmission path from the DUT 10 to the testing apparatus 20, a characteristic of the transmission path is deteriorated. Further, since the constitution of the performance board 15 is complicated, it is difficult to increase the number of pins of an output terminal and an input terminal. In comparison with that, according to the examples described with respect to FIGS. 1 to 5, it is possible to test properly the whole of the DUT 10 including the output buffer 110 and the input buffer 120 without deteriorating the characteristic of the transmission path between the DUT 10 and the testing apparatus 20.

According to the present invention, it is possible to perform a testing by using a logic signal of higher frequency.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus for testing a device under test having therein a self-testing unit, comprising:
    a comparator for receiving a signal output from the device under test and converting the signal into a logic signal by comparing the signal with a first reference voltage;
    a driver for amplifying the logic signal converted by the comparator to be output to the device under test on the basis of a second reference voltage and outputting the amplified logic signal to the device under test;
    a comparator setting unit for determining the first reference voltage so as to compensate for a delay amount of a reception signal received from the device under test and setting said comparator to be the first reference voltage; and a driver setting unit for determining the second reference voltage on the basis of the reference voltage of said comparator and setting said driver to be the second reference voltage.

2. The testing apparatus as claimed in claim 1, wherein said driver amplifies the logic signal converted by said comparator on the basis of the second reference voltage and outputting it to the device under test.

3. The testing apparatus as claimed in claim 1, wherein said driver setting unit raises the second reference voltage to a voltage higher than it was in case said comparator lowers the first reference voltage to a voltage lower than it was.

4. A testing apparatus, which includes an equalizer able to set an amplification amount for each frequency component and tests a device under test having therein a self-testing unit, comprising:
   a reception side equalizer for receiving and amplifying a signal output from the device under test;
   a transmission side equalizer for amplifying the signal received from the reception side equalizer and outputting the amplified signal to the device under test;
   a reception side equalizer setting unit for determining an amplification amount by which said reception side equalizer amplifies a predetermined frequency component of a reception signal received from the device under test so as to compensate for a delay amount of the reception signal and setting the reception side equalizer to be the amplification amount; and
   a transmission side equalizer setting unit for determining an amplification amount by which said transmission side equalizer amplifies a predetermined frequency component of a transmission signal transmitted to the device under test on the basis of the amplification amount set by said reception side equalizer setting unit and setting the transmission side equalizer to be the amplification amount.

5. The testing apparatus as claimed in claim 4, wherein said transmission side equalizer further amplifies the signal amplified by said reception side equalizer and transmits it to the device under test.

6. The testing apparatus as claimed in claim 4, wherein said transmission side equalizer setting unit increases the amplification amount of the transmission signal transmitted to the device under test in case said reception side equalizer setting unit increases the amplification amount by which the predetermined frequency component is amplified.

7. A setting method of a testing apparatus for testing a device under test having therein a self-testing unit,
wherein the testing apparatus comprises:
   a comparator for receiving a signal output from the device under test and converting the signal into a logic signal by comparing the signal with a first reference voltage; and
   a driver for amplifying the logic signal converted by the comparator on the basis of a second reference voltage and outputting the amplified logic signal to the device under test, and
the testing method comprises:
   a comparator setting step of determining the first reference voltage so as to compensate for a delay amount of a reception signal received from the device under test and setting said comparator to be the first reference voltage; and
   a driver setting step of determining the second reference voltage on the basis of the reference voltage of said comparator and setting said driver to be the second reference voltage.

8. A setting method of a testing apparatus, which includes an equalizer able to set an amplification amount for each frequency component and tests a device under test having therein a self-testing unit,
wherein the testing apparatus comprises:
   a reception side equalizer for receiving and amplifying a signal output from the device under test; and
   a transmission side equalizer for amplifying the signal received from the reception side equalizer and outputting the amplified signal to the device under test, and
the setting method comprises:
   a reception side equalizer setting step of determining an amplification amount by which said reception side equalizer amplifies a predetermined frequency component of a reception signal received from the device under test so as to compensate for a delay amount of the reception signal and setting the reception side equalizer to be the amplification amount; and
   a transmission side equalizer setting step of determining an amplification amount by which said transmission side equalizer amplifies a predetermined frequency component of a transmission signal transmitted to the device under test on the basis of the amplification amount set in said reception side equalizer setting step and setting the transmission side equalizer to be the amplification amount.

* * * * *